(12) United States Patent
Ninomiya et al.

(10) Patent No.: US 7,642,599 B2
(45) Date of Patent: Jan. 5, 2010

(54) SEMICONDUCTOR DEVICE AND JUNCTION TERMINATION STRUCTURE

(75) Inventors: Hideaki Ninomiya, Kanagawa (JP); Tomoki Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 404 days.

(21) Appl. No.: 11/331,160

(22) Filed: Jan. 13, 2006

(65) Prior Publication Data
US 2006/0113613 A1 Jun. 1, 2006

Related U.S. Application Data

(62) Division of application No. 10/689,608, filed on Oct. 22, 2003, now Pat. No. 7,119,379.

(30) Foreign Application Priority Data
Sep. 12, 2003 (JP) ............................. 2003-322014

(51) Int. Cl.
*H01L 23/62* (2006.01)
*H01L 27/088* (2006.01)
(52) U.S. Cl. ................. 257/355; 257/173; 257/328; 257/360; 257/401; 257/452; 257/E21.355
(58) Field of Classification Search ................ None
See application file for complete search history.

(56) References Cited

U.S. PATENT DOCUMENTS 3,643,139 A * 2/1972 Nienhuis ................. 257/365
4,792,840 A 12/1988 Nadd
5,804,868 A 9/1998 Kobayashi et al.
6,262,454 B1 7/2001 Legnani et al.
6,535,390 B1 3/2003 Lo
6,680,515 B1 1/2004 Hsing
7,129,558 B2 * 10/2006 Skocki .................. 257/484
2003/0209774 A1 11/2003 Jimbo et al.
2004/0178441 A1 * 9/2004 Yanagisawa ............. 257/327

FOREIGN PATENT DOCUMENTS

| JP | 6-97469 | 4/1994 |
| JP | 2000-22175 | 1/2000 |
| JP | 2000-294803 | 10/2000 |
| WO | WO 94/16462 | 7/1994 |

* cited by examiner

*Primary Examiner*—Matthew C Landau
*Assistant Examiner*—James M Mitchell
(74) *Attorney, Agent, or Firm*—Oblon, Spivak, McClelland, Maier & Neustadt, L.L.P.

(57) ABSTRACT

A semiconductor device disclosed herein comprises: a first base region which is of a first conductivity type; a second base region which is of a second conductivity type and which is selectively formed on a major surface of the first base region; a stopper region which is of a first conductivity type and which is formed on the major surface of the first base region, the stopper region being a predetermined distance away from the second base region and surrounding the second base region; and a ring region which is of a second conductivity type which is formed on the major surface of the first base region between the second base region and the stopper region, the ring region being spirally around the second base region and electrically connected to the second base region and the stopper region.

11 Claims, 16 Drawing Sheets

SEMICONDUCTOR DEVICE AND JUNCTION TERMINATION STRUCTURE

CROSS REFERENCE TO RELATED APPLICATION

This application is a divisional of co-pending U.S. patent application Ser. No. 10/689,608, filed Oct. 22, 2003, which claims benefit of priority under 35 U.S.C. §119 Japanese Patent Applications No. 2003-322014, filed on Sep. 12, 2003, the entire contents of each of which are incorporated by reference herein.

BACKGROUND OF THE INVENTION

1. Field of the Invention

The present invention relates to a junction termination structure of a semiconductor device such as a diode, a MOSFET, an IGBT, a thyristor, and a transistor.

2. Related Background Art

FIG. 11 is a plane diagram showing the structure of a related semiconductor device, taking a power diode having high-breakdown voltage as an example. FIG. 12 is a cross sectional diagram taken along the A-A' line in the plane diagram in FIG. 11. As is seen in FIG. 11 and FIG. 12, this semiconductor device includes an N-type base region 1, a P-type base region 2, an N-type cathode region 3, an anode electrode 4, a cathode electrode 5, P-type ring regions 8, and an N-type stopper region 6. A stopper electrode 7 is further formed on a major surface of the stopper region 6. An insulation film 10 is formed on a major surface of the base region 1 between the stopper electrode 7 and the anode electrode 4. This insulation film 10 is not formed on the ring regions 8, but gaps are formed on the ring regions 8, and ring electrodes 9 are formed to fill these gaps.

The N-type base region 1, the P-type base region 2, the N-type cathode region 3, the anode electrode 4, and the cathode electrode 5 constitute a diode portion, and the P-type ring regions 8 and the N-type stopper region 6 constitute a junction termination relaxing portion. Note that FIG. 11 shows the plane diagram in which the anode electrode 4, the ring electrode 9, the insulation film 10, and the stopper electrode 7 are omitted.

Further, as a semiconductor device of a high-breakdown-voltage planar P-i-N diode, the structure shown in FIG. 21 is well known. As shown in FIG. 21, the semiconductor device includes an N⁻ base region 101, an N⁺ cathode region 102, a P anode region 103, a guard ring 104, field limiting rings 105, a channel stopper 106, a cathode electrode 107, and an anode electrode 108. Further, an insulation film 211 is formed on a termination region 110 surrounding the guard ring 104, and an electrode 109 is formed on the channel stopper 106.

When a voltage is applied between the anode electrode 108 and the cathode electrode 107 so as to reverse-bias a pn-junction formed by the N⁻ base region 101 and the P anode region 103, a depletion region expands in the N⁻ base region 101 from this pn-junction toward the cathode electrode 107. The depletion region also expands from the guard ring 104 at the same time, but when the depletion region reaches the field limiting ring 105a, a potential of the field limiting ring 105a is fixed at a value at this instant, and the depletion region starts to expand from the field limiting ring 105a. Thus, potentials of the field limiting rings 105 are subsequently fixed and the depletion region expands from the field limiting rings 105, thereby relaxing an electric field strength in an edge portion of the guard ring 104, so that a high breakdown voltage is obtainable. Therefore, with the increase in breakdown voltage, the number of the field limiting rings 105 needs to be increased.

FIG. 22 shows the electric field right under the insulation film 211 when the pn-junction formed by the N⁻ base region 101 and the P anode region 103 is reverse-biased. The sum of areas of the portions indicated by hatching in FIG. 22 is a reverse bias voltage.

In the semiconductor device shown in FIG. 11 and FIG. 12, a high breakdown voltage is obtained by the optimum design (layout) of the P-type ring regions 8, but in this method, as an applied voltage becomes higher, the number of the P-type ring regions 8 also needs to be increased, which has posed a problem of difficulty in optimum design. Generally, the potentials of the P-type ring regions 8 are not fixed, and when a high voltage is applied, the design for uniformly dispersing the electric field, namely, the design of the number of the P-type ring regions 8 and the intervals therebetween is more difficult for a higher-breakdown-voltage product. For example, when 1000 V is applied to the stopper electrode 7 and the cathode electrode 5 and 0 V is applied to the anode electrode 4, this 1000 V voltage is divided among the P-type ring regions 8 in order to maintain the breakdown voltage between the stopper electrode 7 and the anode electrode 4, but it is difficult to specify a numerical value of the voltage of each of the P-type ring regions 8, which makes the design of the breakdown voltage extremely difficult.

In addition, even when appropriate design is achieved, there still remains such a problem that, if an interface state due to heavy metal contamination and so on is generated on an interface between the surface insulation film 10 and the N-type base region 1, the optimum conditions are not satisfied. Therefore, such a semiconductor device also confronts a problem of being susceptible to a disturbance in a fabrication process.

Further, the semiconductor device shown in FIG. 21 has such a problem that, as is seen from FIG. 22, the electric field is not generated in the field limiting rings 105 since they themselves are not depleted, which necessitates increasing the length of a termination region (termination length) in order to attain a predetermined breakdown voltage. Therefore, the semiconductor device shown in FIG. 21 has such a problem that, since the number of the field limiting rings 105 has to be increased in order to attain a high breakdown voltage, a termination length L becomes longer as the breakdown voltage becomes higher, so that the area of the P anode region 103 serving as an actual current path becomes smaller even with the same chip area, which worsens a on-state characteristic.

SUMMARY OF THE INVENTION

In order to accomplish the aforementioned and other objects, according to one aspect of the present invention, a semiconductor device comprises:

a first base region which is of a first conductivity type;

a second base region which is of a second conductivity type and which is selectively formed on a major surface of the first base region;

a stopper region which is of a first conductivity type and which is formed on the major surface of the first base region, the stopper region being a predetermined distance away from the second base region and surrounding the second base region; and a ring region which is of a second conductivity type which is formed on the major surface of the first base region between the second base region and the stopper region, the ring region being spirally around the second base region and electrically connected to the second base region and the stopper region.

According to another aspect of the present invention, a semiconductor device comprises:

a base region which is of a first conductivity type;

an anode region which is of a second conductivity type and which is selectively formed on a major surface of the base region;

a surface protective film which is formed on the major surface of the base region;

a conductive field plate which is formed in a circular ring shape on the surface protective film to surround the anode region; and an auxiliary electrode which is formed in the surface protective film and electrically connected to the field plate, a capacitance being formed between the auxiliary electrode and the base region.

According to another aspect of the present invention, a semiconductor device comprises:

a base region which is of a first conductivity type;

an anode region which is of a second conductivity type and which is selectively formed on a major surface of the base region; and a ring region which is of a second conductivity type and which is formed in a circular ring shape on the major surface of the base region to surround the anode region, the ring region having an impurity concentration lower than the anode region.

DESCRIPTION OF THE PREFERRED EMBODIMENTS

Figure 1:
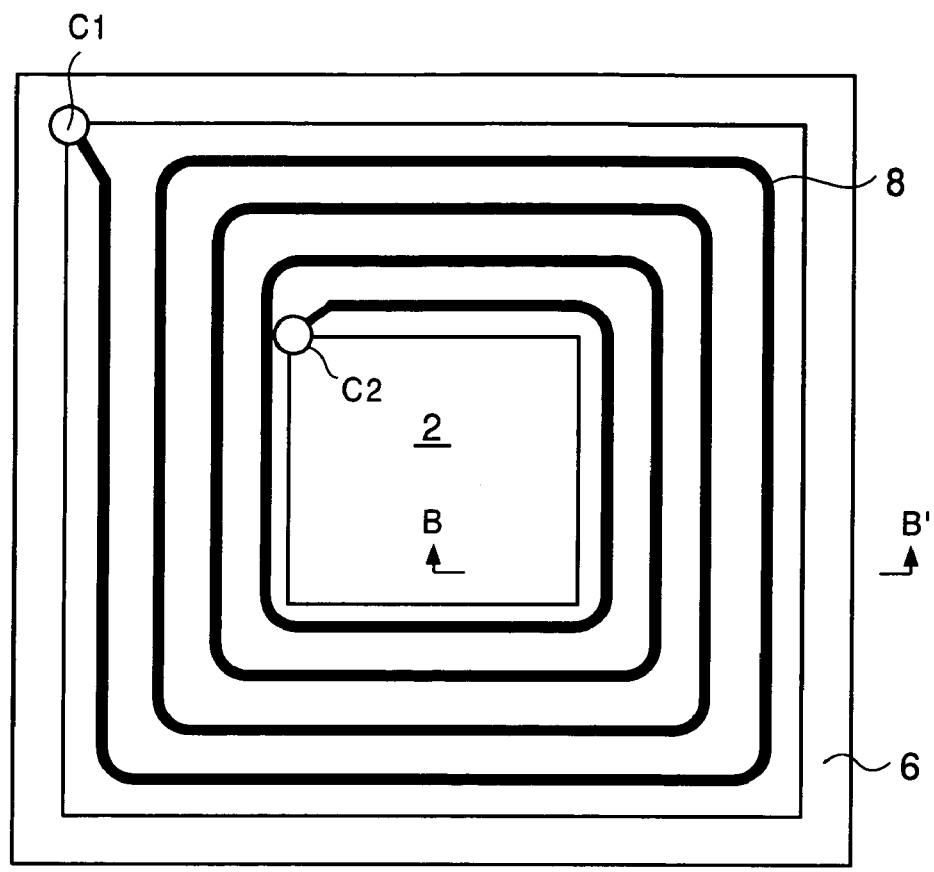
FIG. 1 is a plane diagram of a semiconductor device according to a first embodiment.

Hereinafter, embodiments of the present invention will be explained based on the drawings. In the embodiments to be described below, an N-type is defined as a first conductivity type and a P-type is defined as a second conductivity type, but they may be defined in a reverse manner. Further, the same reference numerals and symbols are used to designate portions corresponding to those in the semiconductor device shown in FIG. 11 and FIG. 12 and detailed explanation thereof will be omitted.

First Embodiment

Figure 2:
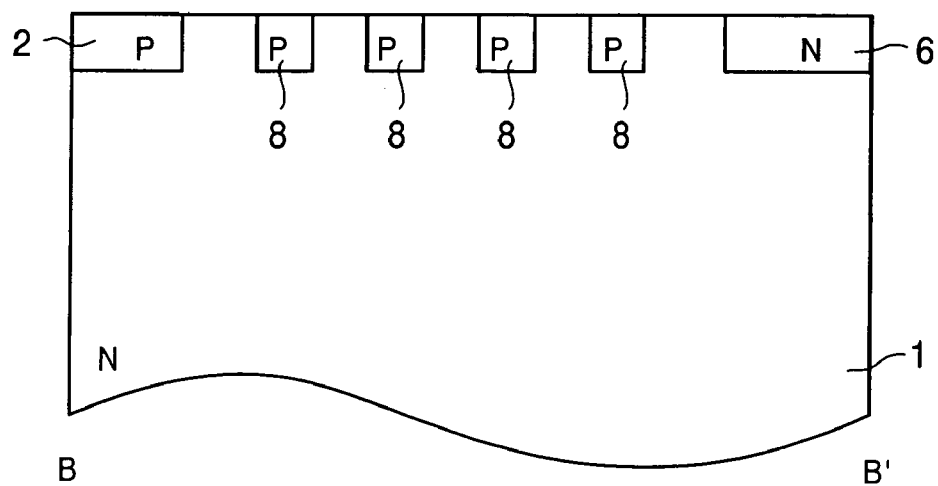
FIG. 2 is a cross sectional diagram taken along the B-B' line in the semiconductor device in FIG. 1.
Figure 11:
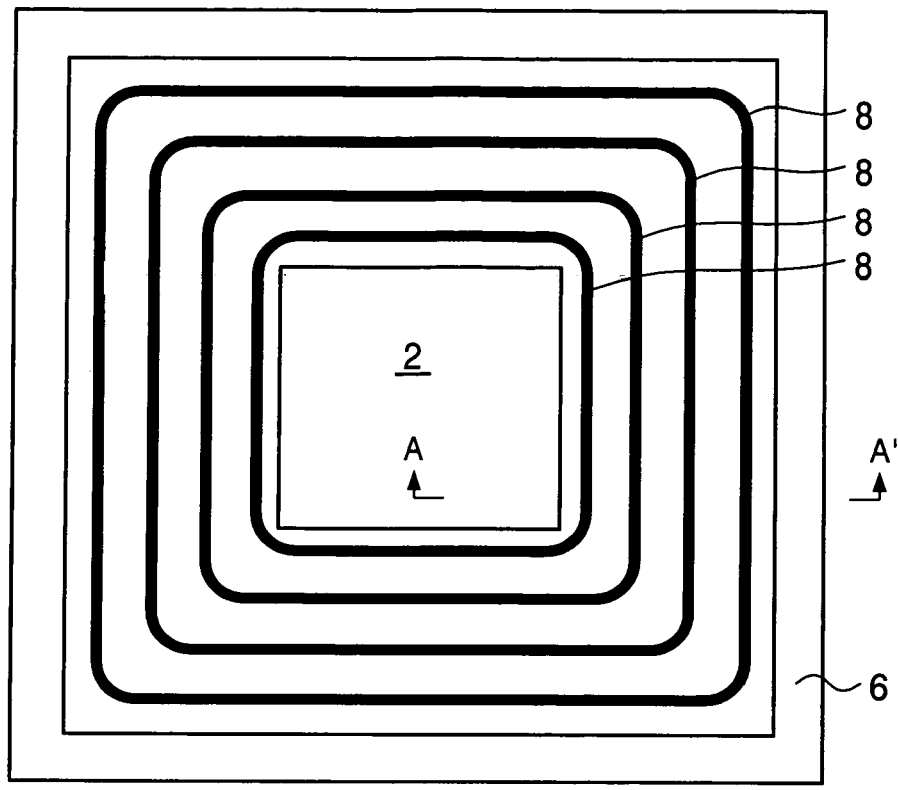
FIG. 11 is a plane diagram of a related semiconductor device.
Figure 12:
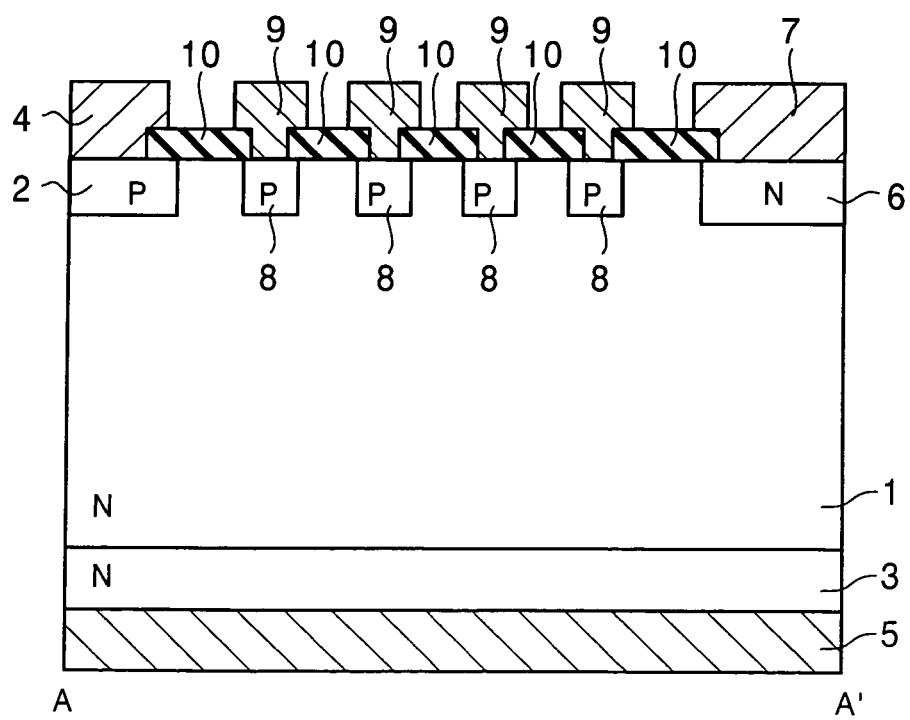
FIG. 12 is a cross sectional diagram taken along the A-A' line in the semiconductor device in FIG. 11.

FIG. 1 is a plane diagram of a semiconductor device according to a first embodiment and is a diagram corresponding to FIG. 11 discussed above. FIG. 2 is a cross sectional diagram taken along the B-B' line in FIG. 1 and is a diagram corresponding to FIG. 12 discussed above. The semiconductor device shown in FIG. 1 and FIG. 2 is different from the semiconductor device shown in FIG. 11 and FIG. 12 in that a P-type ring region 8 is formed as one spiral line connected to a P-type base region 2 and an N-type stopper region 6.

Specifically, as shown in FIG. 1 and FIG. 2, the N-type stopper region 6 is formed along an outer periphery of the N-type base region 1 on a major surface side thereof. The P-type base region 2 is formed in a center portion of the N-type base region 1 on the major surface side thereof. The P-type ring region 8 is spirally formed around the P-type base region 2 on the major surface of the N-type base region 1 between the N-type stopper region 6 and the P-type base region 2. One end of this P-type ring region 8 is electrically connected to the N-type stopper region 6 via a connecting portion C1, and the other end of the P-type ring region 8 is electrically connected to the P-type base region 2 via a connecting portion C2.

In the semiconductor device shown in FIG. 1 and FIG. 2, when a high voltage is applied to the N-type stopper region 6, a current according to a diffused layer resistance flows through the P-type ring region 8. For example, when 1000 V is applied to the N-type stopper region 6 and 0 V is applied to the P-type base region 2, a current flows through the P-type ring region 8 based on this 1000 V potential difference. Therefore, the potential of the P-type ring region 8 becomes higher from a P-type base region 2 side toward an N-type stopper region 6 side. This means that the adjustment of the diffused layer resistance in one circle of the P-type ring region 8 makes it possible to fix a difference in potential from an adjacent circumferential portion of the P-type ring region 8, which allows uniform dispersion of electric field distribution. This can prevent the influence of a disturbance caused by the generation of an interface state.

The diffused layer resistance of the P-type ring region 8 has temperature dependency. Therefore, the increase in temperature lowers mobility due to lattice scattering to increase resistance, resulting in the reduction in a leak current which is a current flowing through the P-type ring region 8. Therefore, a problem of thermal runaway breakdown caused by the leak current, which has hitherto been an issue to be solved, can be overcome.

Note that it is considered to be necessary that a resistance value of the entire P-type ring region 8 satisfies the following relationship from a viewpoint of preventing the P-type ring region 8 from generating heat due to the leak current $I_{leak}$ flowing from the N-type stopper region 6 to the P-type base region 2 and from causing thermal runaway due to this generated heat.

$$V_{BD}/R_{ring} \leq I_{leak} = 1 (mA/cm^2) \tag{1}$$

Here, $V_{BD}$ represents the breakdown voltage (V) of this semiconductor device and $R_{ring}$ represents the resistance value (R) of the entire P-type ring region 8. It is expected that the thermal runaway can be avoided by such a design that the leak current $I_{leak}$ flowing through the P-type ring region 8 is equal to or lower than 1 mA per 1 cm² element area.

Second Embodiment

Figure 3:
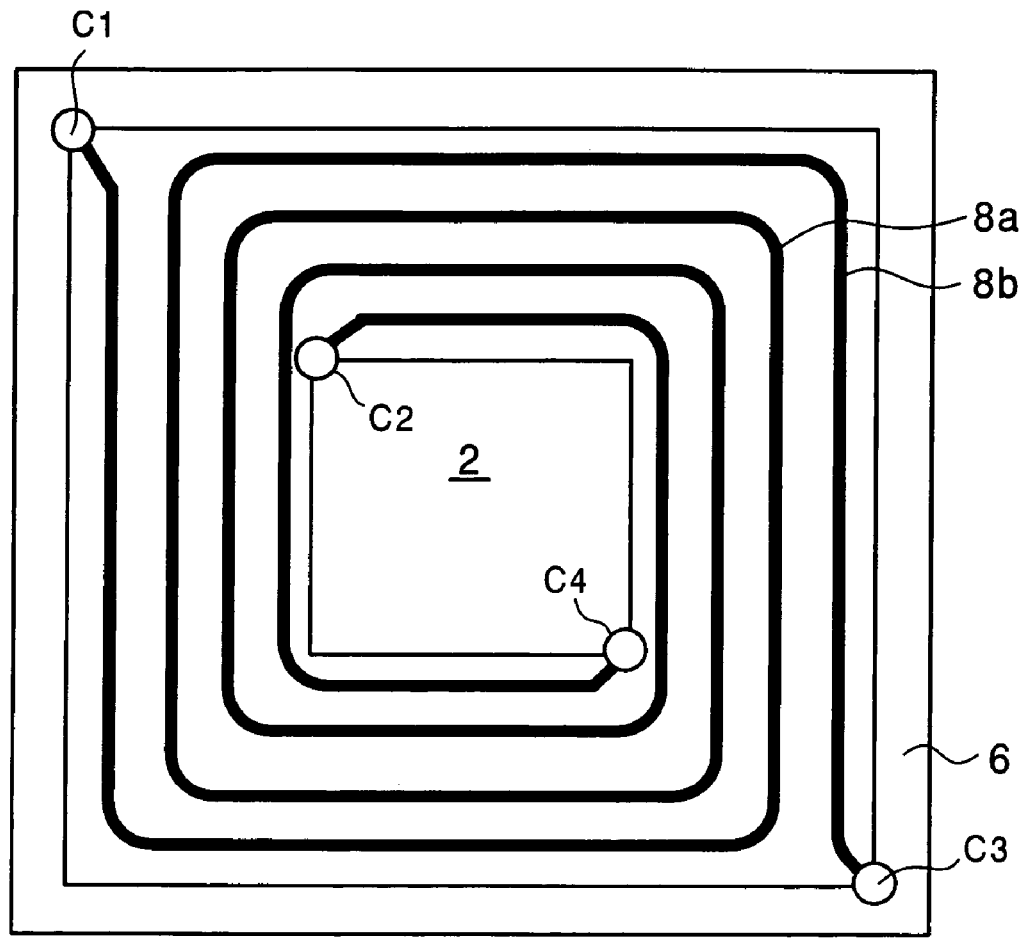
FIG. 3 is a plane diagram of a semiconductor device according to a second embodiment.

FIG. 3 is a plane diagram of a semiconductor device according to a second embodiment and is a diagram corresponding to FIG. 1 in the first embodiment. FIG. 1 shows such a structure that one piece of the P-type ring region 8 is extended, but this structure lacks pattern symmetry in a plane view, which may possibly cause the concentration of an electric field in an imbalancedly arranged region. Therefore, in this embodiment, two pieces of P-type ring regions 8a, 8b are disposed in parallel as shown in FIG. 3 to solve the planar imbalance.

Specifically, one end of the first P-type ring region 8a is connected to an N-type stopper region 6 via a connecting portion C1 and the other end of the first P-type ring region 8a is connected to a P-type base region 2 via a connecting portion C2. One end of the second P-type ring region 8b is connected to the N-type stopper region 6 via a connecting portion C3 and the other end of the P-type ring region 8b is connected to the P-type base region 2 via a connecting portion C4.

Figure 4:
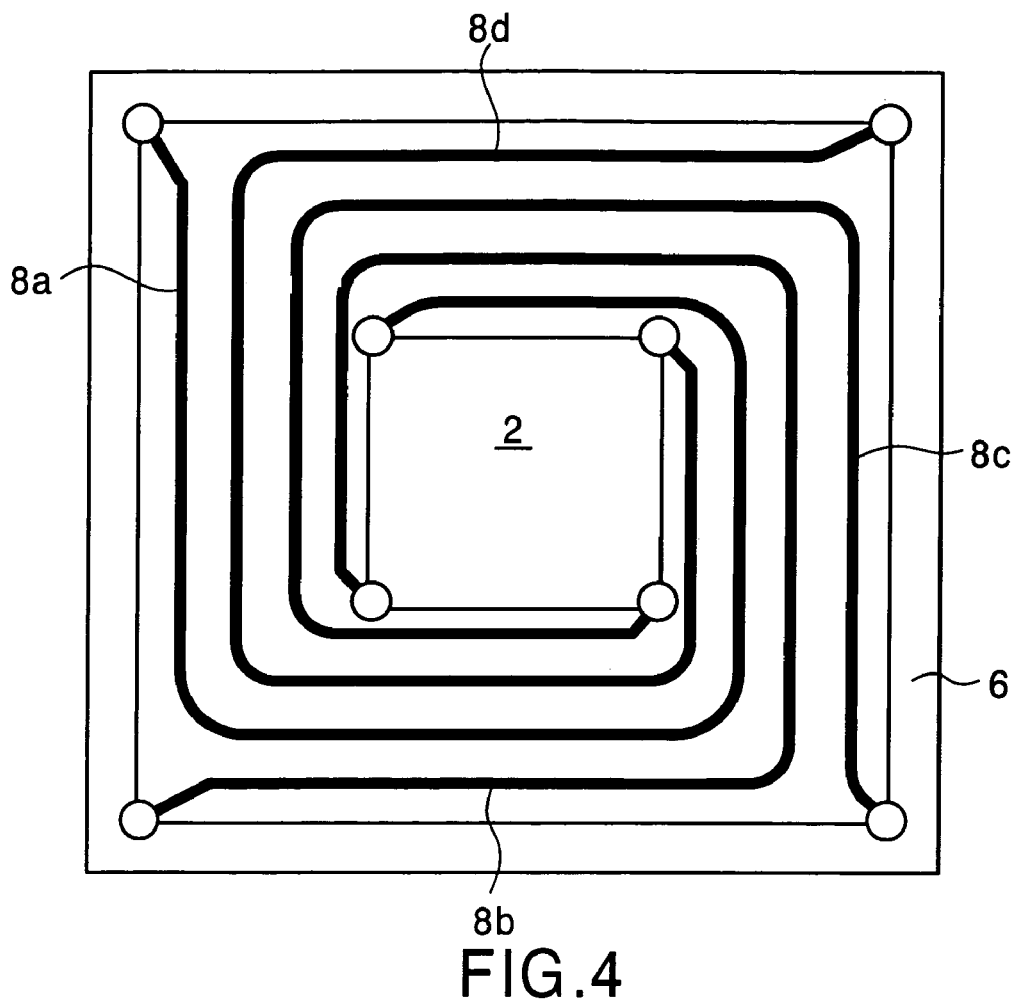
FIG. 4 is a plane diagram showing a modification example of the semiconductor device according to the second embodiment.

FIG. 4 is a diagram showing a modification example of the second embodiment. As is seen from FIG. 4, the example in FIG. 4 is so structured that four pieces of P-type ring regions 8a to 8d are spirally formed in parallel to prevent the concentration of the electric field. Such formation of the plural pieces of P-type ring regions 8 realizes the planar symmetry, so that nonuniform distribution of the electric field can be solved.

Third Embodiment

Figure 5:
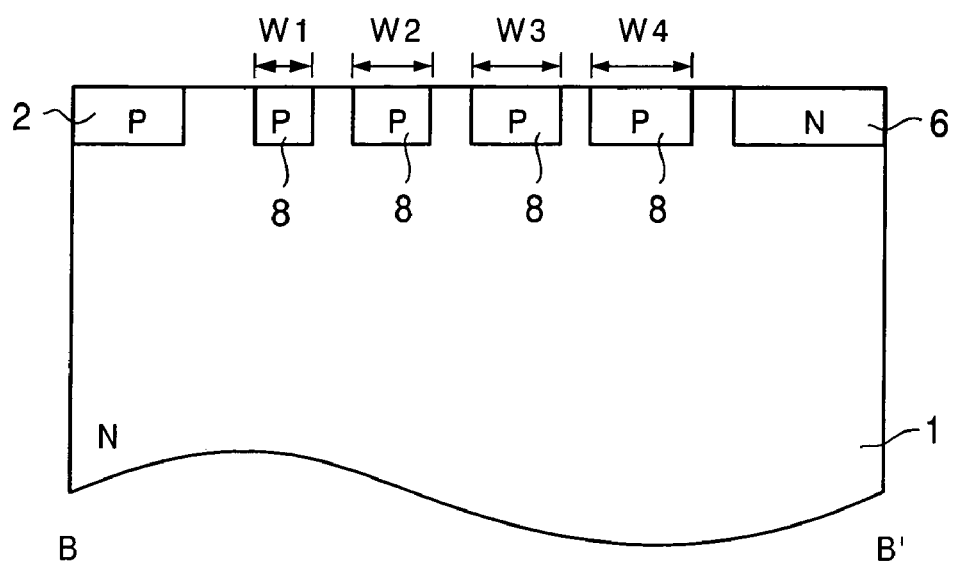
FIG. 5 is a cross sectional diagram of a semiconductor device according to a third embodiment.

FIG. 5 is a cross sectional diagram of a semiconductor device according to a third embodiment and is a diagram corresponding to FIG. 2 in the first embodiment. In the above-described first embodiment, the adjustment of the diffused layer resistance of the P-type ring region 8 is described as a method for realizing the uniform dispersion of the electric field, but in this method, it is necessary that potential differences between adjacent circumferential portions of the P-type ring region 8 are equal to one another. In the spiral arrangement of the P-type ring region 8, however, as the P-type ring region 8 gets closer to an outer circumferential side (N-type stopper region 6 side), the wiring length becomes longer, so that the diffused layer resistance of the P-type ring region 8 is increased, which causes a large potential difference.

Therefore, in this embodiment, the semiconductor device in the first embodiment is modified in such a manner that, as shown in FIG. 5, the width of the P-type ring region 8 is increased from a P-type anode region 2 side toward an N-type stopper region 6 side, thereby reducing the diffused layer resistance. In other words, the relationship of the width W1<width W2<width W3<width W4 holds in FIG. 5. This design makes it possible to equalize the potential differences between adjacent circumferential portions of the P-type ring region 8, so that uniform distribution of the electric field is obtainable from an inner side to an outer side.

Fourth Embodiment

Figure 6:
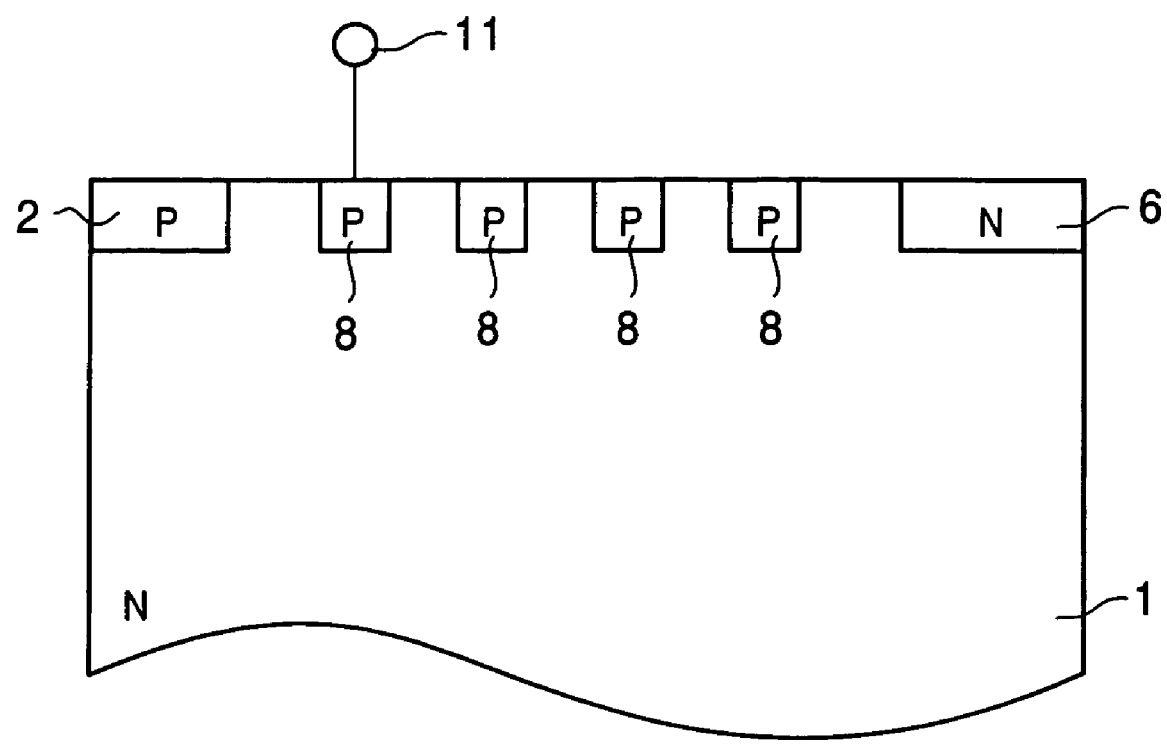
FIG. 6 is across sectional diagram of a semiconductor device according to a fourth embodiment.

FIG. 6 is a cross sectional diagram of a semiconductor device according to a fourth embodiment and is a diagram corresponding to FIG. 2 in the first embodiment. Note that this embodiment is applicable to any one of the above-described first to third embodiments and later-described fifth and sixth embodiments.

As shown in FIG. 6, in the semiconductor device according to this embodiment, a sense electrode 11 is connected to one circumferential portion of a P-type ring region 8 positioned on an inner side, the sense electrode 11 being usable as a protective function in case an excessive voltage is applied. In this structure, the potential of the P-type ring region 8 is fixed and utilized is such a function that a high voltage applied to the N-type stopper region 6 is divided among inner circumferential portions of the P-type ring region 8. The sense electrode 11 is thus disposed, so that a divided voltage applied between the N-type stopper region 6 and a P-type anode region 2 can be easily monitored with a low-voltage output.

For example, this sense electrode 11 is disposed at such a position of the P-type ring region 8 that the distance thereof to the P-type anode region 2 and the distance thereof to the N-type stopper region 6 are in the ratio of 1:1000, and when a voltage of 1 V is detected from this sense electrode 11, it can be deduced that 1000 V is applied to the N-type stopper region 6.

Fifth Embodiment

Figure 7:
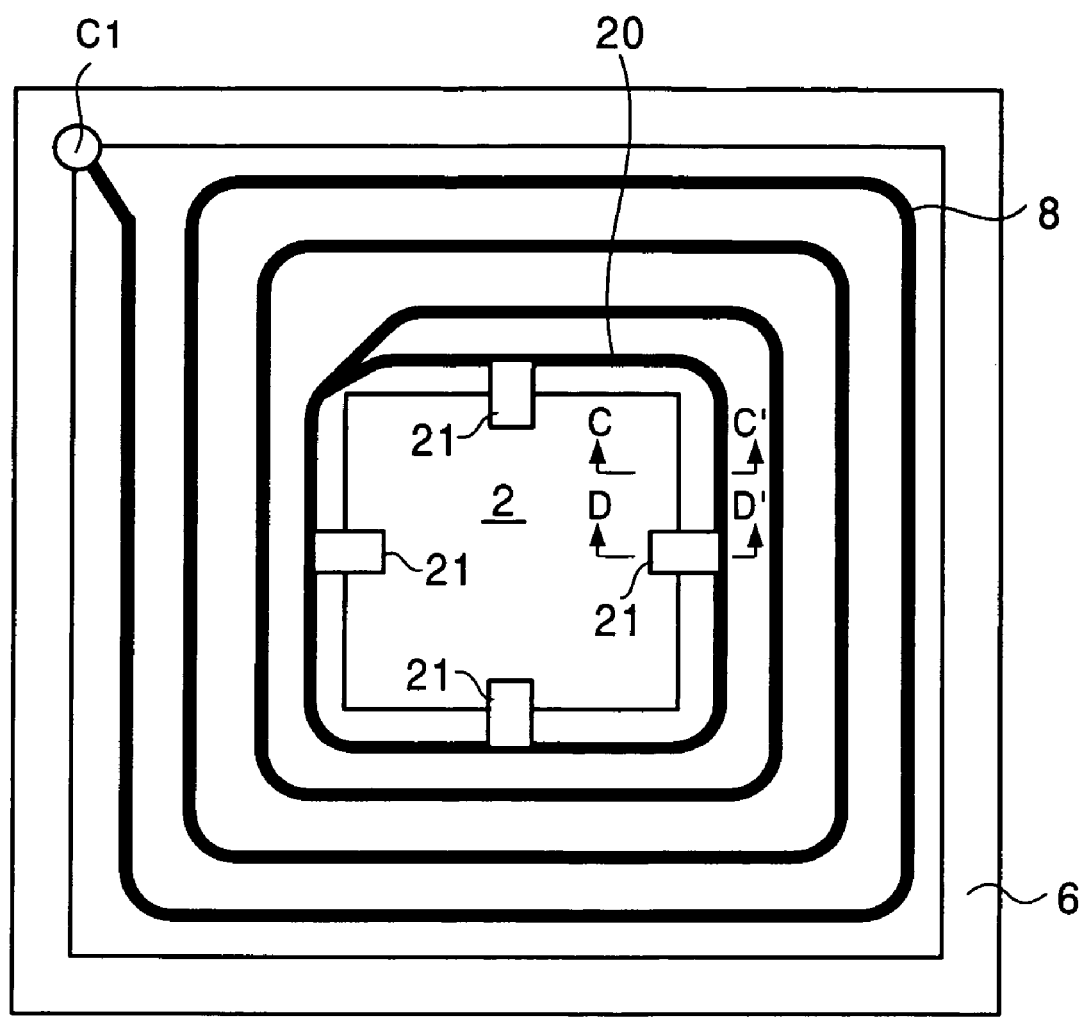
FIG. 7 is a plane diagram of a semiconductor device according to a fifth embodiment.
Figure 8:
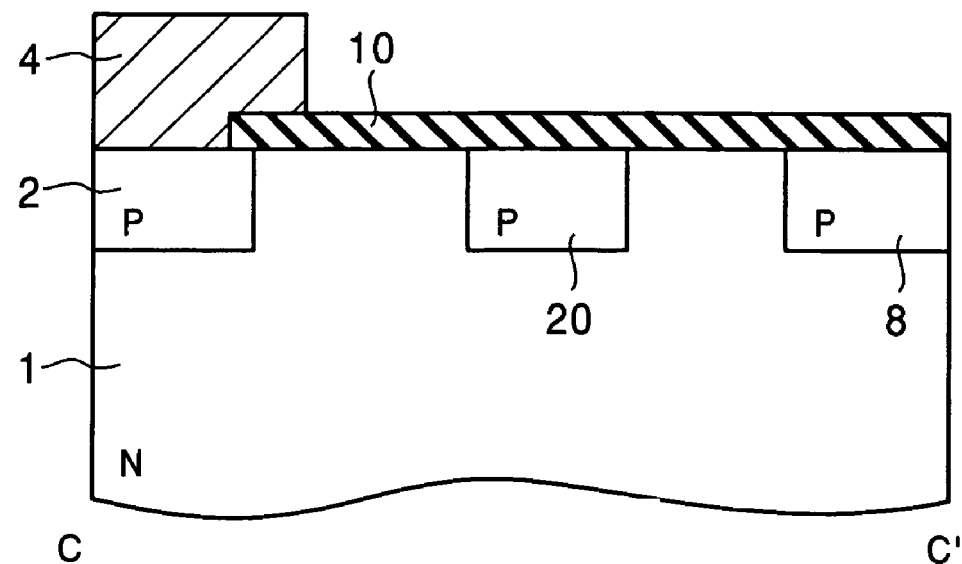
FIG. 8 is a cross sectional diagram taken along the C-C' line in the semiconductor device in FIG. 7.
Figure 9:
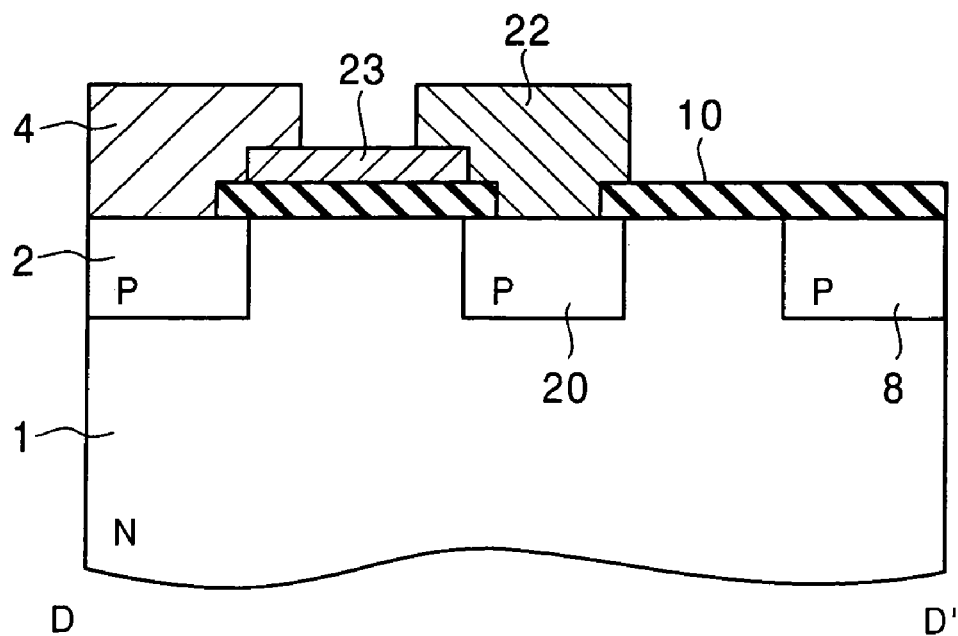
FIG. 9 is a cross sectional diagram taken along the D-D' line in the semiconductor device in FIG. 7.

FIG. 7 is a plane diagram of a semiconductor device according to a fifth embodiment and is a diagram corresponding to FIG. 1 in the first embodiment. FIG. 8 is a fragmentary cross sectional diagram taken along the C-C' line in FIG. 7, and FIG. 9 is a fragmentary cross sectional diagram taken along the D-D' line in FIG. 7. Incidentally, FIG. 7 to FIG. 9 show an example where this embodiment is applied to the first embodiment, but this embodiment is also applicable to the other embodiments.

As shown in FIG. 7, in the semiconductor device according to this embodiment, an inner most circumferential portion of the P-type ring region 8 is formed as one circular ring to constitute a circular ring portion 20. Specifically, the circular ring portion 20 is formed to surround a P-type base region 2, and this circular ring portion 20 is connected to the P-type base region 2 via four connecting portions 21.

To be in more detail, electrodes 22 are formed on four upper-side positions on the circular ring portion 20, as shown in FIG. 8 and FIG. 9. The electrodes 22 are connected to an anode electrode 4 via connecting electrodes 23, and as a result, the circular ring portion 20 is electrically connected to the P-type base region 2. As is understood from the above explanation, the electrodes 22 and the connecting electrodes 23 constitute connecting portions 21 in this embodiment. Further, the circular ring portion 20 is partly connected to the P-type ring region 8 as shown in FIG. 7.

Note that, in this embodiment, for example, the anode electrode 4 and the electrodes 22 are made of the same aluminum. An insulation film 10 is formed of a silicon oxide film, and the connecting electrodes 23 are made of polysilicon doped with impurities.

Such a structure that the circular ring portion 20 is disposed in the inner most circumferential portion makes it possible to relax the electric field in the innermost circumferential portion where the electric field becomes the highest.

Sixth Embodiment

Figure 10:
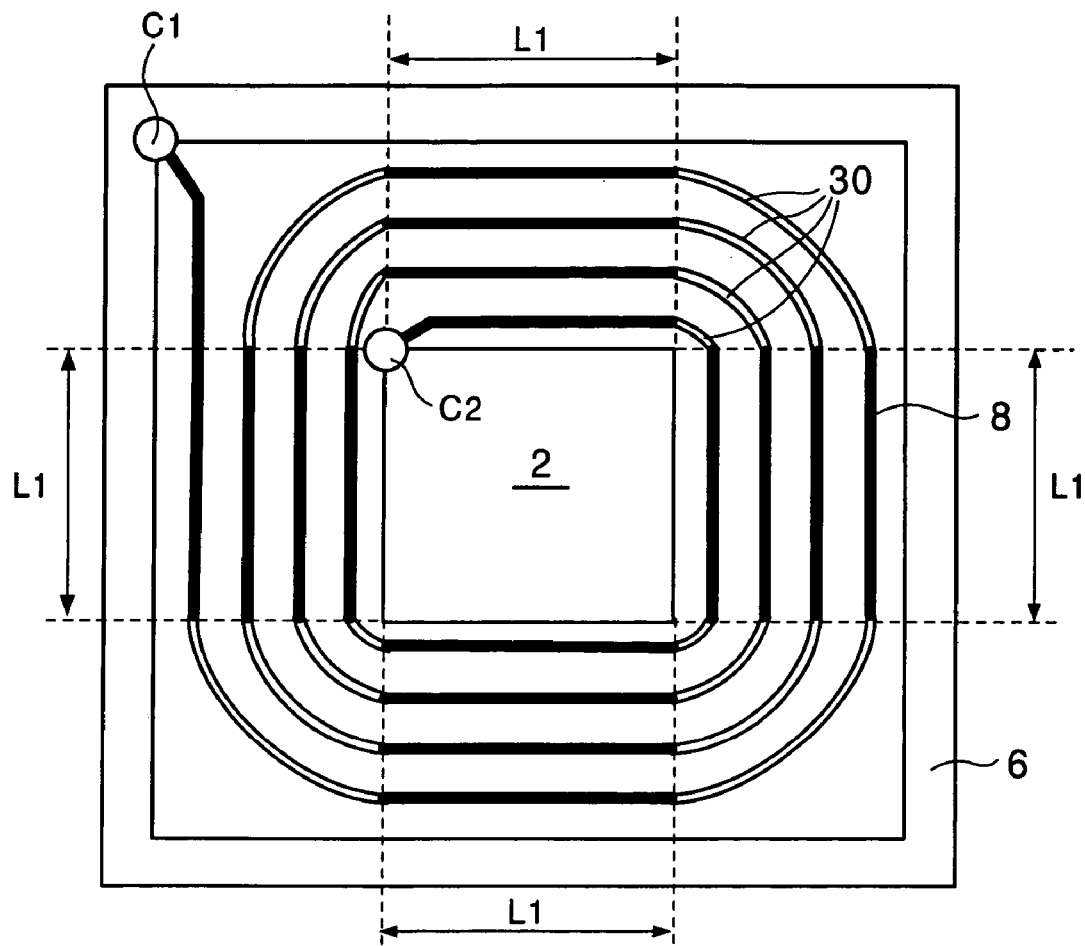
FIG. 10 is a plane diagram of a semiconductor device according to a sixth embodiment.

FIG. 10 is a plane diagram of a semiconductor device according to a sixth embodiment and is a diagram corresponding to FIG. 1 in the first embodiment. FIG. 10 shows an example where this embodiment is applied to the first embodiment, but this embodiment is also applicable to the other embodiments.

As is seen from FIG. 10, in the semiconductor device of this embodiment, the above-described first embodiment is so modified that the length of straight portions of a P-type ring region 8 are made equal to one another irrespective of whether they are on an inner circumferential side or an outer circumferential side. In the example shown in FIG. 10, all of the straight portions of the P-type ring region 8 have the same length of L1. At corner portions, metal regions 30 are formed on the P-type ring region 8 as corner auxiliary members which are lower in resistance than the P-type ring region 8, thereby realizing the reduction in resistance.

In this structure, a current at the corner portions flows through the metal regions 30 which are far lower in resistance than the P-type ring region 8. Consequently, resistances on the inner circumferential side and on the outer circumferential side can be made equal when a current flows from an N-type stopper region 6 toward a base region 2, which can facilitate designing. In other words, resistance values are made equal due to the equal length of the straight portions of the P-type ring region 8 irrespective of whether they are on the inner circumferential side or the outer circumferential side, and the low-resistance metal regions 30 are disposed at the corner portions, and therefore, the resistance is substantially negligible.

Incidentally, in all of the above-described first to sixth embodiments, square semiconductor devices are used for explaining the present invention, but the present invention is also applicable to semiconductor devices in the shape of rectangle, circle, and so on. Moreover, in the drawings which are used, the P-type ring region 8 is wound clockwise about fourfold, but the winding direction may be reversed and the number of winding times may be any as long as it is once or more. Other various modifications may be made to embody the present invention without departing from the spirit of the present invention.

Seventh Embodiment

Figure 13:
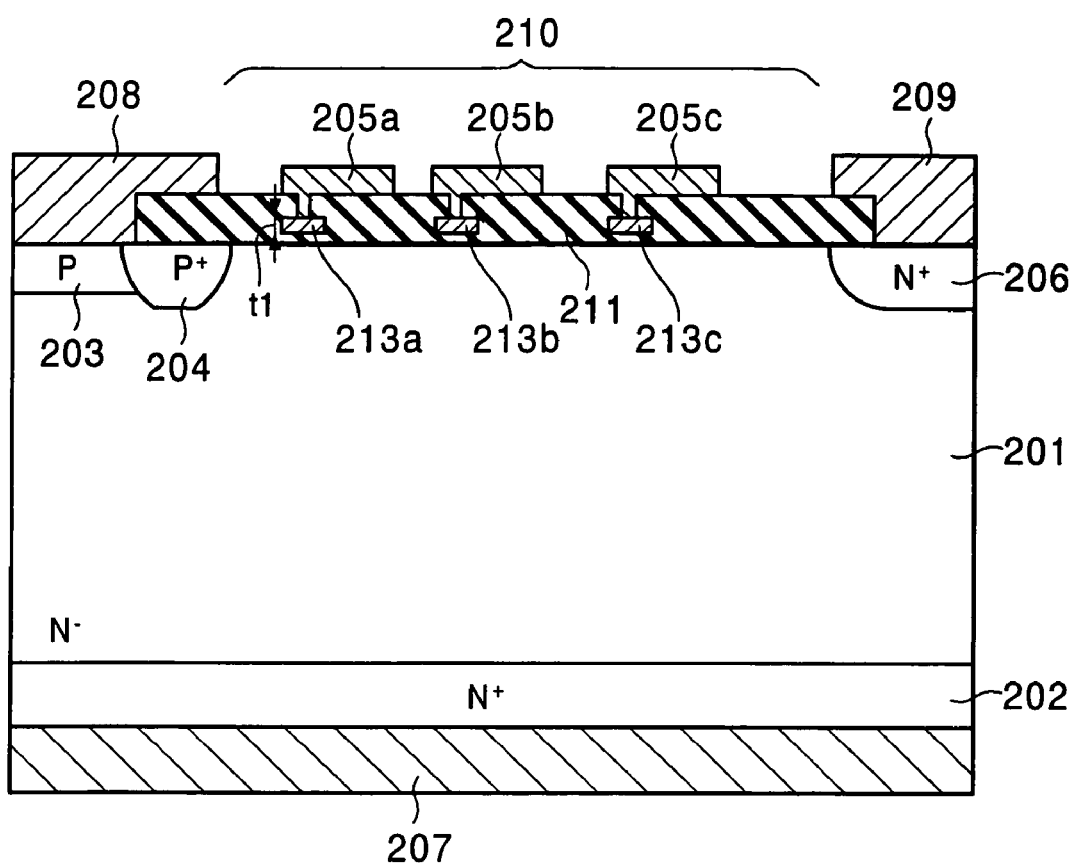
FIG. 13 is a cross sectional diagram of a semiconductor device according to a seventh embodiment.

FIG. 13 is a cross sectional diagram of a semiconductor device according to a seventh embodiment. As shown in FIG. 13, this semiconductor device includes an N⁻ base region 201, an N⁺ cathode region 202, a P anode region 203, a guard ring 204, conductive field plates 205, a channel stopper 206, a cathode electrode 207, and an anode electrode 208. Further, an insulation film 211 is formed on a termination region 210 surrounding the guard ring 204, and an electrode 209 is formed on the channel stopper 206. In addition, electrodes 213 are electrically connected to the field plates 205. The electrodes 213 constitute auxiliary electrodes in this embodiment.

When a voltage is applied between the anode electrode 208 and the cathode electrode 207 so as to reverse-bias a pn-junction formed by the N⁻ base region 201 and the P anode region 203, a depletion region expands from the guard ring 204, but when the depletion region reaches right under the field plate 205a, a capacitance formed by the electrode 213a, the insulation film 211, and the N⁻ base region 201 is charged, so that potentials of the electrode 213a and the field plate 205a are fixed.

Since the field plate 205a itself is formed on the insulation film 211, the electric field of a portion in the N⁻ base region 201 where the electrodes 213 are not formed is relaxed. Thus, the potentials of the electrodes 213 and the field plates 205 are subsequently fixed to relax the electric field under the field plates 205, so that the electric field strength on an edge portion of the guard ring 204 is relaxed to realize a high break down voltage.

Further, the field plates 205 are divided to the field plates 205a, 205b, 205c, and consequently, even the generation of fixed charges on an interface between the insulation film 211 and the N⁻ base region 201 or even the influence of charges outside the semiconductor device only causes a shift of a place where the electric field strength is the strongest but does not cause a change in the maximum value of the electric field strength, so that reliability is improved.

Note that the number of the field plates 205 and the electrodes 213 is determined by a breakdown voltage of the semiconductor device, and it is necessary to increase the number of the field plates 205 and the electrodes 213 as the breakdown voltage becomes higher. Further, the field plates 205 are generally covered with an insulation film, though not shown, so as to prevent them from being influenced by an external environment. This insulation film is formed of glass such as a silicon oxide film or a silicon nitride film or of an insulation film such as various kinds of ceramic or polyimide.

Figure 14:
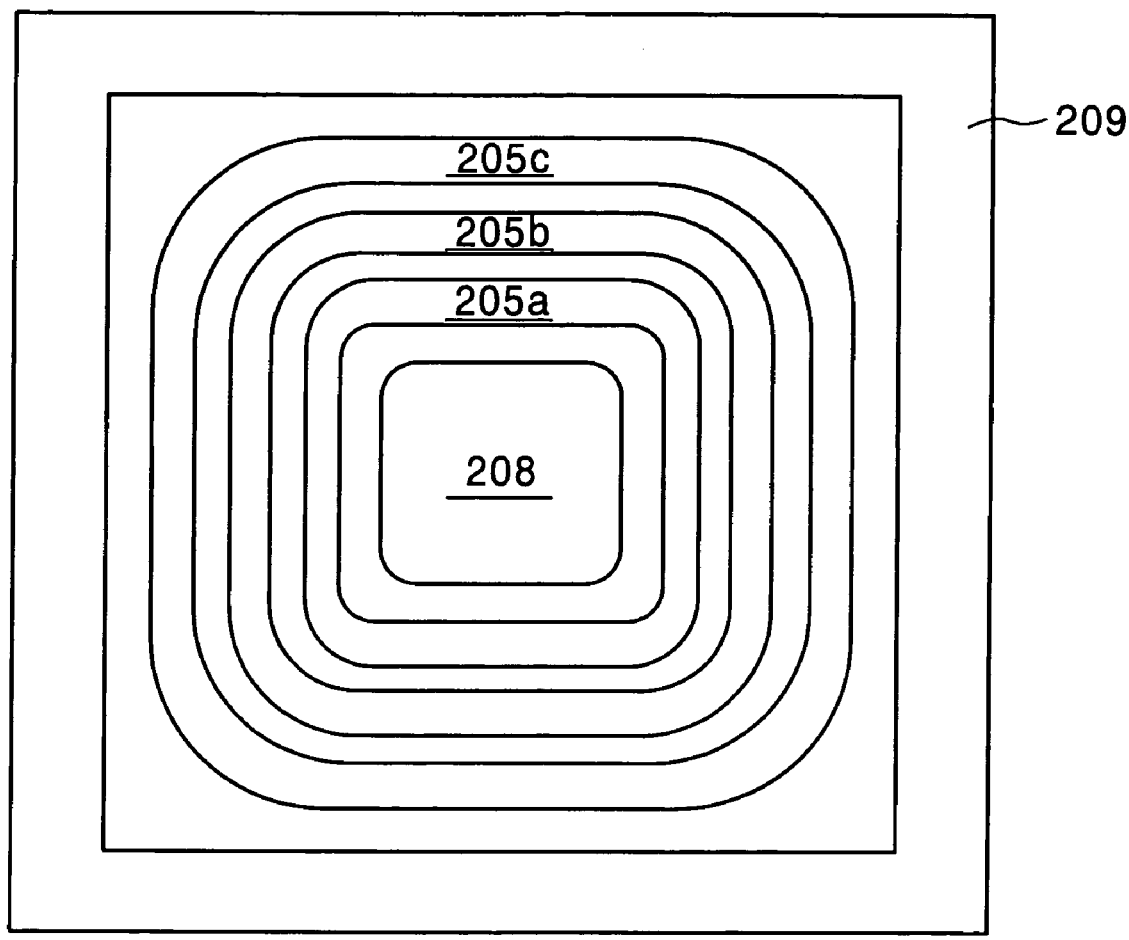
FIG. 14 is a plane diagram of the semiconductor device in FIG. 13.

A plane diagram of the semiconductor device according to this embodiment is shown in FIG. 14. Specifically, the field plates 205a, 205b, 205c are formed in a circular ring shape around the anode electrode 208 to surround this anode electrode 208.

Figure 15:
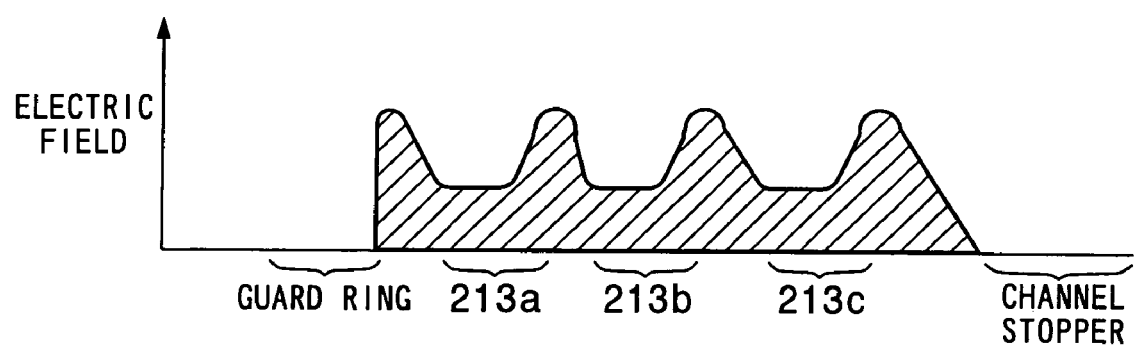
FIG. 15 is a chart showing electric field distribution right under an insulation film in the semiconductor device in FIG. 13.
Figure 21:
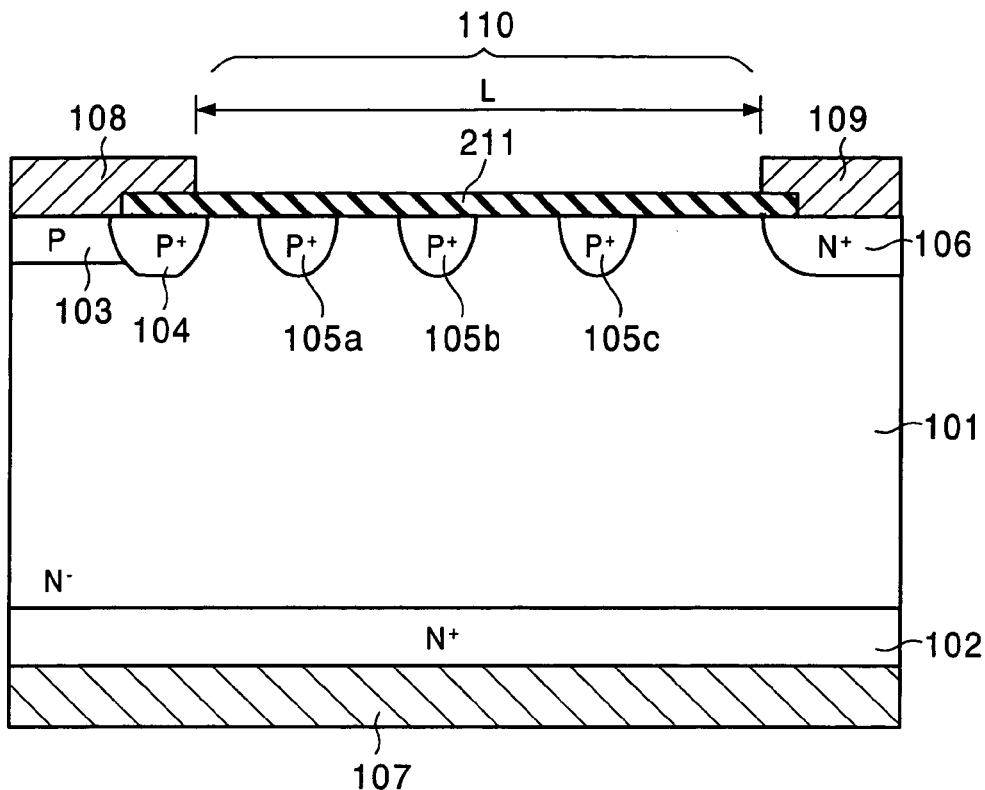
FIG. 21 is a cross sectional diagram of a related semiconductor device.
Figure 22:
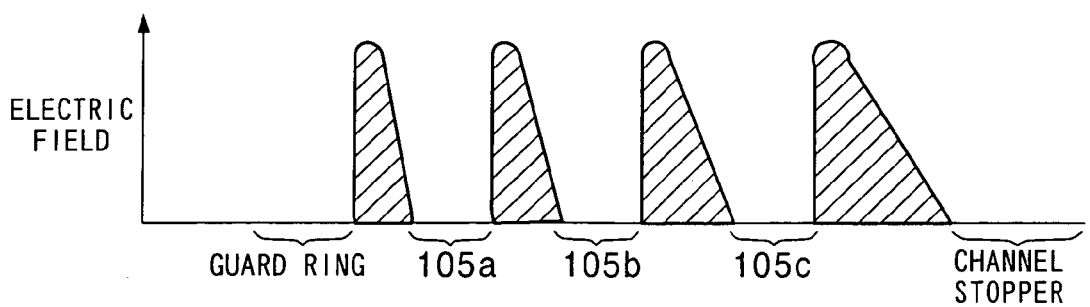
FIG. 22 is a chart showing electric field distribution right under an insulation film in the semiconductor device in FIG. 21.

An electric field right under the insulation film 11 when a pn-junction formed by the N⁻ base region 201 and the P anode region 203 is reverse-biased is shown in FIG. 15. Unlike the structure shown in FIG. 22, this structure has no portion which is not depleted like the field limiting rings 105, and has no portion where the electric field becomes zero, so that the maximum electric field becomes lower than that of the semiconductor device shown in FIG. 21. Further, a termination length L necessary to attain a predetermined breakdown voltage can be made shorter.

Since the electrodes 213 are formed in the insulation film 211, there is a possibility that the electrodes 213 may undergo a high-temperature heat treatment at 900° C. or higher after being formed. Therefore, the electrodes 213 are made of polysilicon or high-melting-point metal such as Mo, Ta, or W which can withstand the high-temperature heat treatment. It is also possible to reduce the width of the electrodes 213 (1 μm to 5 μm) by forming a thickness t1 of the electrodes 213 to be about 100 nm to 500 nm. This can improve termination efficiency since the length of portions with a low electric field is smaller as the width of the potential fixed portions 213 of the field plates 205 is smaller.

Note that the distance between the electrodes 213 becomes larger from a guard ring 204 side toward a channel stopper 206 side.

Further, such a structure may be adopted, though not shown, that the field plate 205a which is the closest to the anode electrode 208 is connected to the anode electrode 208. This structure makes it possible to effectively relax the electric field on a junction portion, where the electric field tends to be high, between the guard ring 204 and the N⁻ base region 201.

Eighth Embodiment

Figure 16:
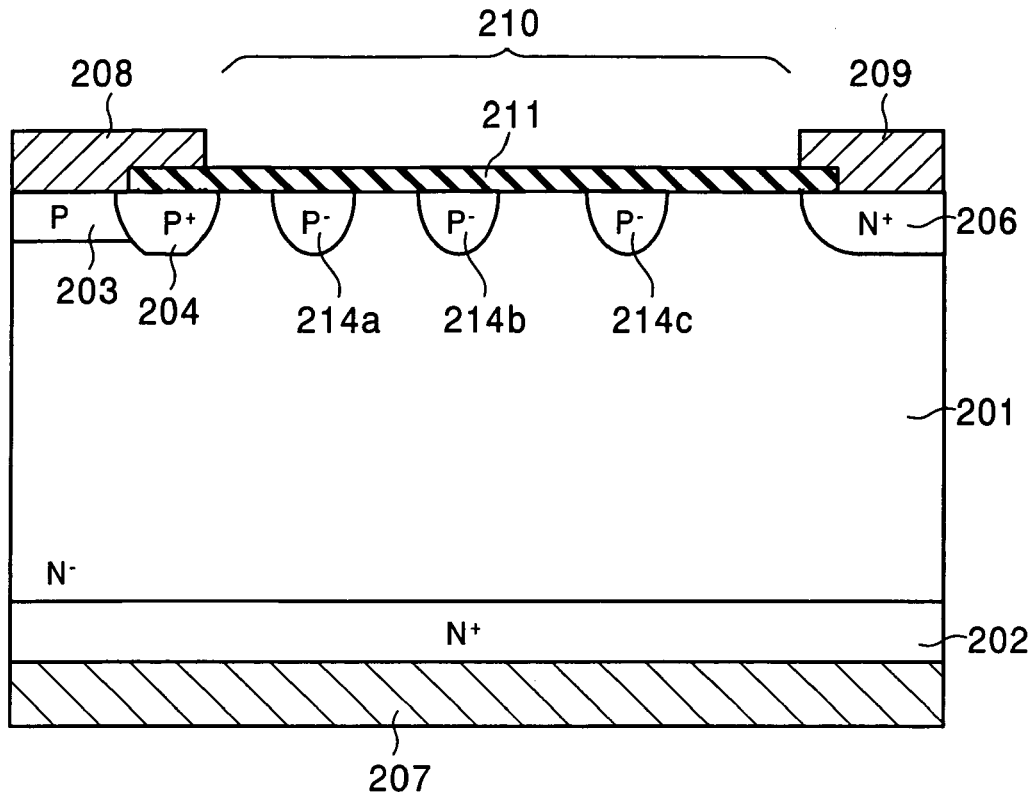
FIG. 16 is a cross sectional diagram of a semiconductor device according to an eighth embodiment.

FIG. 16 is a diagram showing a semiconductor device (diode) according to an eighth embodiment. As shown in FIG. 16, this semiconductor device includes an N⁻ base region 201, an N⁺ cathode region 202, a P anode region 203, a guard ring 204, a channel stopper 206, a cathode electrode 207, and an anode electrode 208. An insulation film 211 is further formed on a termination region 210 surrounding the guard ring 204. An electrode 209 is further formed on the channel stopper 206. In addition, P⁻ ring regions 214 (214a, 214b, 214c) are formed on a major surface side of the N⁻ base region 201 between the guard ring 204 and the channel stopper 206. These P⁻ ring regions 214a, 214b, 214c are formed in a circular ring shape to surround the P anode region 203.

When a voltage is applied between the anode electrode 208 and the cathode electrode 207 so as to reverse-bias a pn-junction formed by the N⁻ base region 201 and the P anode region 203, a depletion region expands from the guard ring 204. When the depletion region reaches the P⁻ ring region 214a, the P⁻ ring region 214a starts to be depleted. At this time, plus charges are supplied to the N⁻ base region 201 from the depleted P⁻ ring region 214a, so that the electric field near the P⁻ ring region 214a is relaxed. Thus, the P⁻ ring regions 214 are entirely depleted in sequence to relax the electric field near the P⁻ ring regions 214, so that the electric field strength on an edge portion of the guard ring 204 is relaxed, which realizes a high breakdown voltage. Note that the number of the P⁻ ring regions 214 is determined by the breakdown voltage of the semiconductor device and it is necessary to increase the number of the P⁻ ring regions 214 as the breakdown voltage becomes higher.

Figure 17:
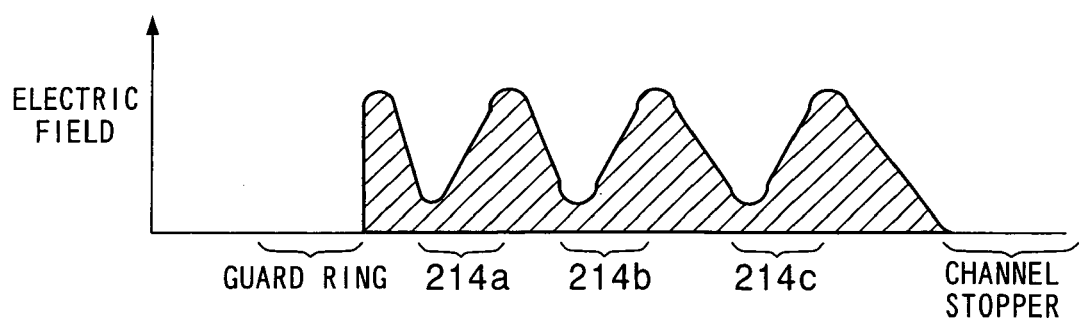
FIG. 17 is a chart showing electric field distribution right under an insulation film in the semiconductor device in FIG. 16.

The electric field right under the insulation film 211 when the pn-junction formed by the N⁻ base region 201 and the P anode region 203 is reverse-biased is shown in FIG. 17. Unlike the structure in FIG. 22, this structure has no portion which is not depleted like the field limiting rings 105, and has no portion where the electric field becomes zero, so that the maximum electric field is lower than that of the semiconductor device in FIG. 21. Further, a termination length L required to attain a predetermined breakdown voltage can be made shorter.

In addition, the P⁻ ring regions 214 are divided into the P⁻ ring regions 214a, 214b, 214c, and consequently, even the generation of fixed charges on an interface between the insulation film 211 and the N⁻ base region 201 or even the influence by charges outside the semiconductor device only causes a shift of a place where the electric field strength is the strongest but does not cause any change in the maximum value of the electric field strength, so that reliability is improved.

Note that the distance between the P⁻ ring regions 214 becomes larger from a guard ring 204 side toward a channel stopper 206 side.

Figure 18:
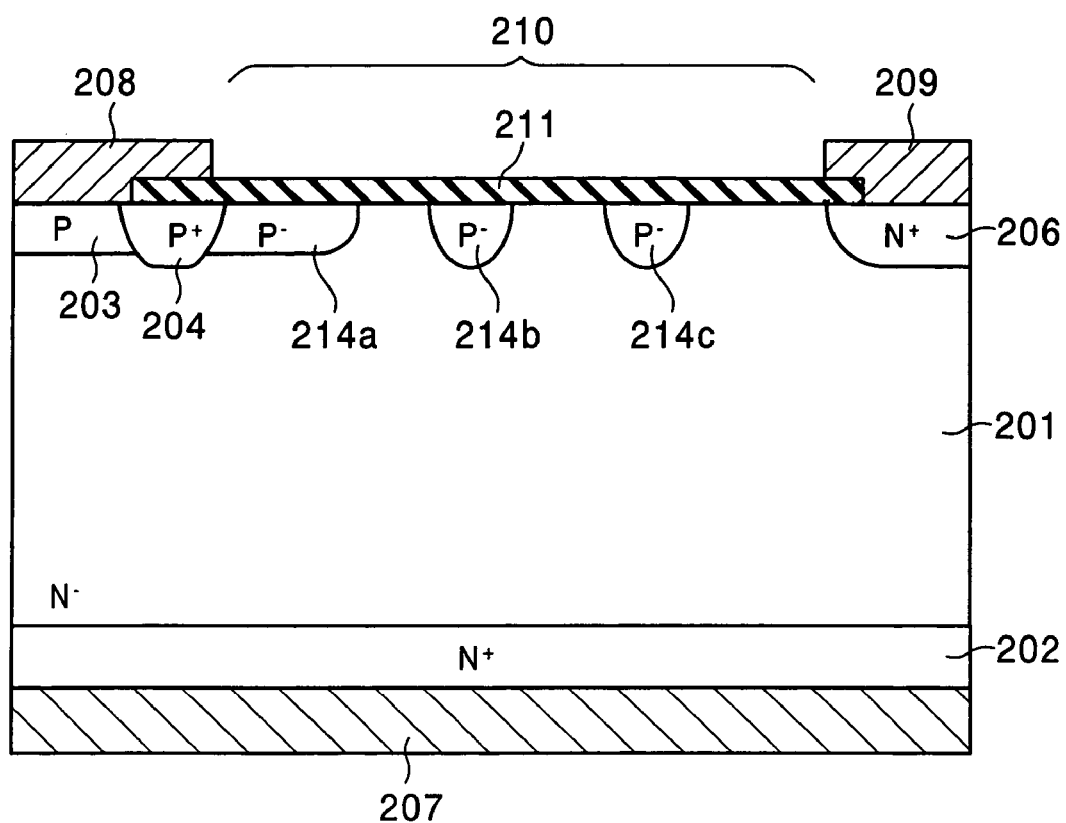
FIG. 18 is a diagram showing a modification example of the semiconductor device according to the eighth embodiment.

Further, as shown in FIG. 18, the P⁻ ring region 214a which is the closest to the anode electrode 208 may be connected to the anode electrode 208. In other words, the P⁻ ring region 214a in an inner most circumferential portion may be electrically connected to the anode region 203. This structure makes it possible to effectively relax the electric field in a junction portion, where the electric field tends to become high, between the guard ring 204 and the N⁻ base region 201.

The study of the conditions for entirely depleting the P⁻ ring regions 214 in this embodiment has led to the following expression.

$$\frac{\varepsilon E_{crit}}{q} \times 1.5 \frac{L}{W_p} > Q_p \tag{2}$$

Here, $\varepsilon$ represents the permittivity of a semiconductor, which is $1.04 \times 10^{-14}$ F/cm for silicon. $E_{crit}$ represents the dielectric breakdown electric field of a semiconductor, which is about $2 \times 10^5$ V/cm for silicon. q represents the elementary charge. L represents the termination length, which is, for example, 1200 μm. Wp represents the thickness of the N⁻ base region 201, which is, for example, 450 μm. Qp represents the impurity amount of the P⁻ ring regions 214. Moreover, it is desirable that the depth of the P⁻ ring regions 214 is 5 μm or larger.

Ninth Embodiment

Figure 19:
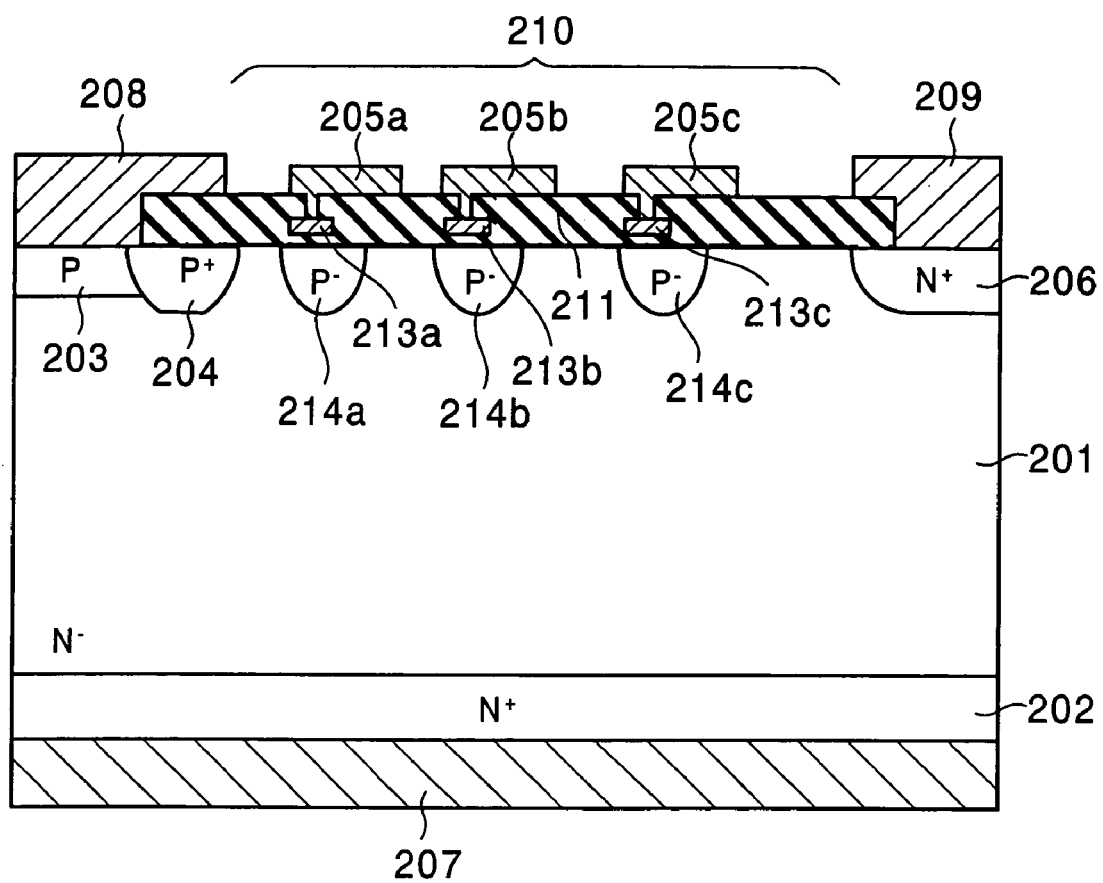
FIG. 19 is a cross sectional diagram of a semiconductor device according to a ninth embodiment.

FIG. 19 is a diagram showing a semiconductor device (diode) according to a ninth embodiment. As shown in FIG. 19, this semiconductor device includes an N⁻ base region 201, an N⁺ cathode region 202, a P anode region 203, a guard ring 204, field plates 205, a channel stopper 206, a cathode electrode 207, and an anode electrode 208. Further, an insulation film 211 is formed on a termination region 210 surrounding the guard ring 104, and an electrode 209 is formed on the channel stopper 206. Electrodes 213 reconnected to the field plates 205. Further, P⁻ ring regions 214 (214a, 214b, 214c) are formed on a major surface side of the N⁻ base region 201 between the guard ring 204 and the channel stopper 206. These P⁻ ring regions 214a, 214b, 214 care formed in a circular ring shape to surround the P anode region 203.

As is seen from this structure, this embodiment is the combination of the seventh embodiment and the eighth embodiment. Such a structure makes it possible to further promote the relaxation of the electric field and improve reliability.

Figure 20:
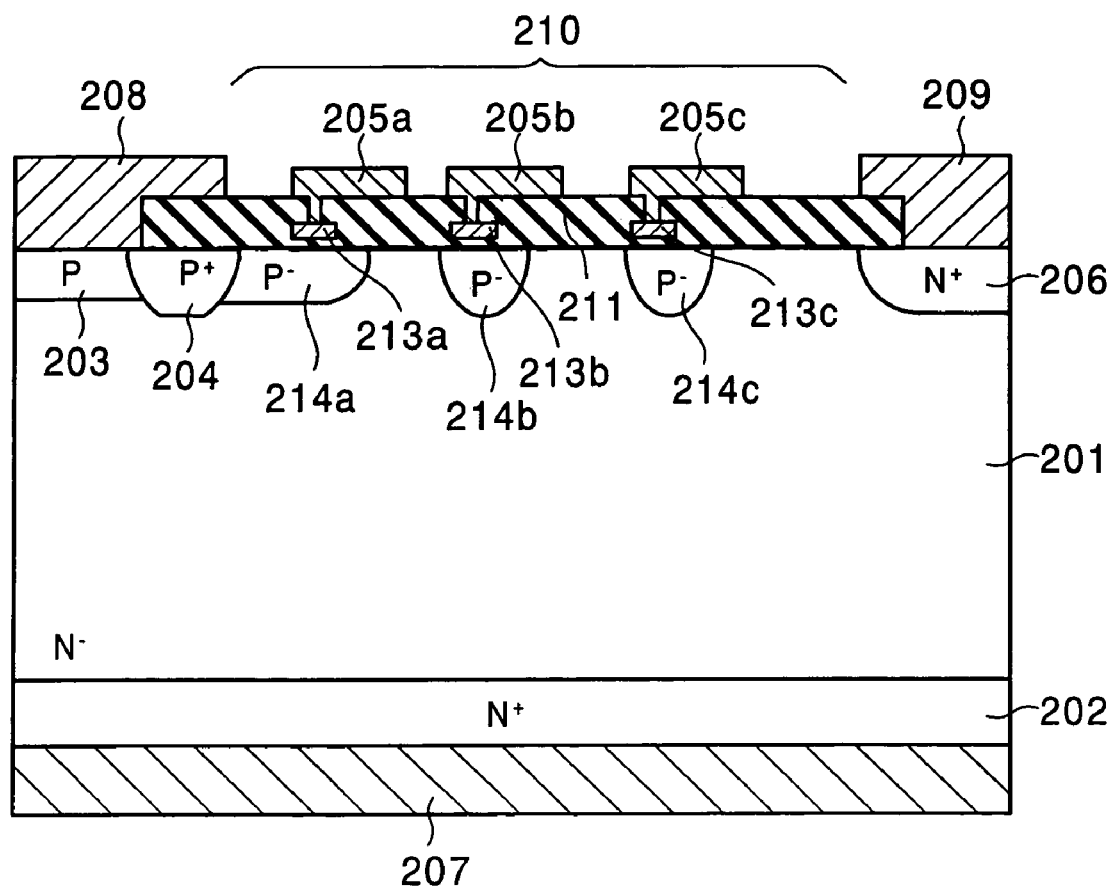
FIG. 20 is a diagram showing a modification example of the semiconductor device according to the ninth embodiment.

Incidentally, the field plates 205 are formed above the P⁻ ring regions 214 in FIG. 19, but the arrangement of the field plates 205 and the P⁻ ring regions 214 is not limited to this form, and various modifications may be made so as to relax the electric field. In addition, the P⁻ ring region 214a which is the closest to the anode electrode 208 maybe connected to the anode electrode 208 as shown in FIG. 20. In other words, the P⁻ ring region 214a in an inner most circumferential portion may be electrically connected to the anode region 203. Such a structure makes it possible to effectively relax the electric field in a junction portion, where the electric field tends to become high, between the guard ring 204 and the N⁻ base region 201.

Incidentally, the insulation film 211 is formed of an insulative film in the above-described seventh to ninth embodiments, but it may be formed of a semi-insulation film such as SIPOS. This means that a surface protective film formed on the major surface of the N⁻ base region 201 may be formed of an insulation film or may be formed of a semi-insulation film.

In the above-described embodiments, diodes are explained, but the present invention is applicable to various kinds of planar semiconductor devices such as bipolar transistors, MOS transistors, thyristors, and IGBTs including a similar pn-junction structure.

In other respects, the present invention is not limited to the above-described embodiments, and various modifications may be made without departing from the spirit of the present invention when it is embodied. Further, inventions of various stages are included in the above-described embodiments, and various inventions are possible to be extracted by appropriate combinations of a plurality of constituent features which are disclosed.

What is claimed is:

1. A semiconductor device comprising:
    a first base region which is of a first conductivity type;
    a second base region which is of a second conductivity type and which is selectively formed on a major surface of the first base region;
    a stopper region which is of a first conductivity type and which is formed on the major surface of the first base region, the stopper region being a predetermined distance away from the second base region and surrounding the second base region; and
    a ring region which is formed of a diffused region of a second conductivity type and which is formed within the first base region between the second base region and the stopper region such that an upper surface of the ring region and the major surface of the first base region are at a same surface level, the ring region being spirally around the second base region and electrically connected to the second base region and the stopper region.

2. The semiconductor device according to claim 1, comprising:
    wherein the ring region are plural and formed in parallel, each of the plural ring region being connected to the second base region and the stopper region.

3. The semiconductor device according to claim 2, wherein $V_{BD}/R_{ring}$ which is a leak current $I_{leak}$ is designed to be equal to 1 mA/cm2 or less, where $V_{BD}$ is a withstand voltage of the semiconductor device and $R_{ring}$ is a resistance of the entire ring region.

4. The semiconductor device according to claim 3, wherein a circular ring portion, which is surrounding the second base region in a circular ring shape and connected to the second base region, is formed in an inner most circumferential portion of the ring region on the major surface of the first base region, and then ring region is connected to the second base region via the circular ring portion.

5. The semiconductor device according to claim 1, comprising:
    wherein a resistance of the ring region becomes lower from a side of the second base region toward a side of the stopper region.

6. The semiconductor device according to claim 5, wherein $V_{BD}/R_{ring}$ which is a leak current $I_{leak}$ is designed to be equal to 1 mA/cm² or less, where $V_{BD}$ is a withstand voltage of the semiconductor device and $R_{ring}$ is a resistance of the entire ring region.

7. The semiconductor device according to claim 5, wherein a circular ring portion, which is surrounding the second base region in a circular ring shape and connected to the second base region, is formed in an inner most circumferential portion of the ring region on the major surface of the first base region, and the ring region is connected to the second base region via the circular ring portion.

8. The semiconductor device according to claim 5, wherein a width of the ring region is increased toward the stopper region.

9. The semiconductor device according to claim 1, further comprising:
    a sense electrode electrically connected to a part of the ring region, the sense electrode being used for detecting a divided voltage applied to the stopper region.

10. The semiconductor device according to claim 9, wherein $V_{BD}/R_{ring}$ which is a leak current $I_{leak}$ is designed to be equal to 1 mA/cm² or less, where $V_{BD}$ is a withstand voltage of the semiconductor device and $R_{ring}$ is a resistance of the entire ring region.

11. The semiconductor device according to claim 9, wherein a circular ring portion, which is surrounding the second base region in a circular ring shape and connected to the second base region, is formed in an inner most circumferential portion of the ring region on the major surface of the first base region, and the ring region is connected to the second base region via the circular ring portion.

* * * * *